United States Patent [19]

Bhargava et al.

[11] Patent Number: 4,873,394
[45] Date of Patent: Oct. 10, 1989

[54] RECEPTACLE PANEL FOR ELECTRONIC DEVICE PROVIDING SIMPLE ASSEMBLY AND RFI SUPPRESSION

[75] Inventors: Vikram Bhargava, Alpharetta; James R. Heberling, Lawrenceville, both of Ga.

[73] Assignee: Hayes Microcomputer Products, Inc., Norcross, Ga.

[21] Appl. No.: 202,084

[22] Filed: Jun. 3, 1988

[51] Int. Cl.[4] .............................................. H05K 9/00
[52] U.S. Cl. .................................. 174/35 R; 361/424
[58] Field of Search .......... 174/35 R, 35 GC, 35 MS, 174/51; 361/424

[56] References Cited

U.S. PATENT DOCUMENTS 4,602,164  7/1986  Gore, III et al. ............... 361/424 X

FOREIGN PATENT DOCUMENTS 3335664  4/1985  Fed. Rep. of Germany .... 174/35 R

*Primary Examiner*—Laramie E. Askin
*Attorney, Agent, or Firm*—Jones, Askew & Lunsford

[57] ABSTRACT

An improved plate for mounting a plurality of receptacles on an electronics device, particularly a data communications peripheral, is disclosed. The plate is designed to be secured to an electronic subassembly which may be dropped into a portion of an enclosure and the plate placed proximate to a large opening in the enclosure. In order to compensate for mechanical tolerances on the fit of the plate within the enclosure, since it is attached to the subassembly, free edges of the plate which may act as an elongated antenna for emitting radio frequency interference are broken up into fingers of predetermined length. This attenuates the radiation from such edge. Additionally, the fingers are bent down to contact an electrically grounded portion of the enclosure to provide further RFI suppression.

8 Claims, 3 Drawing Sheets

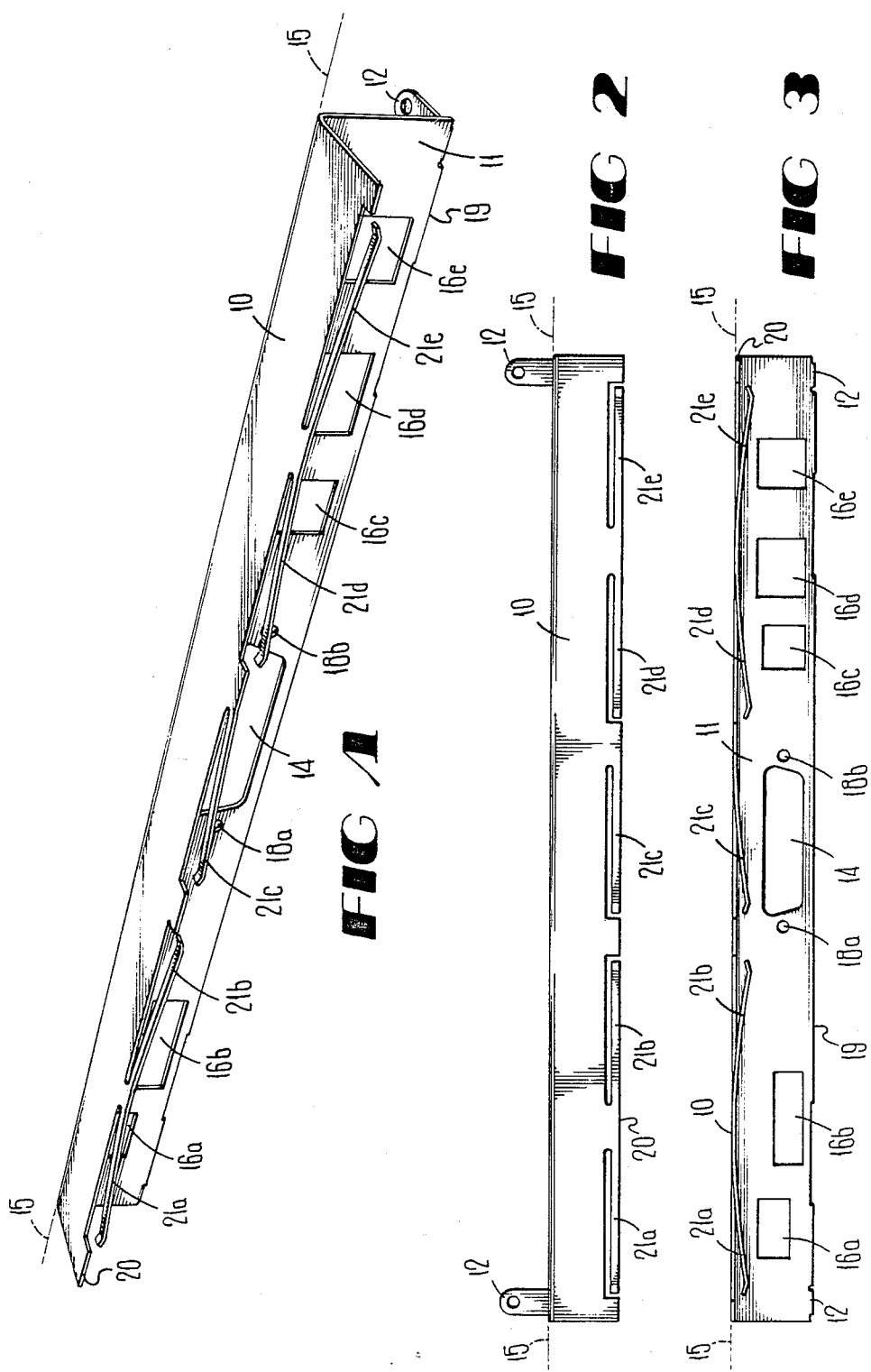

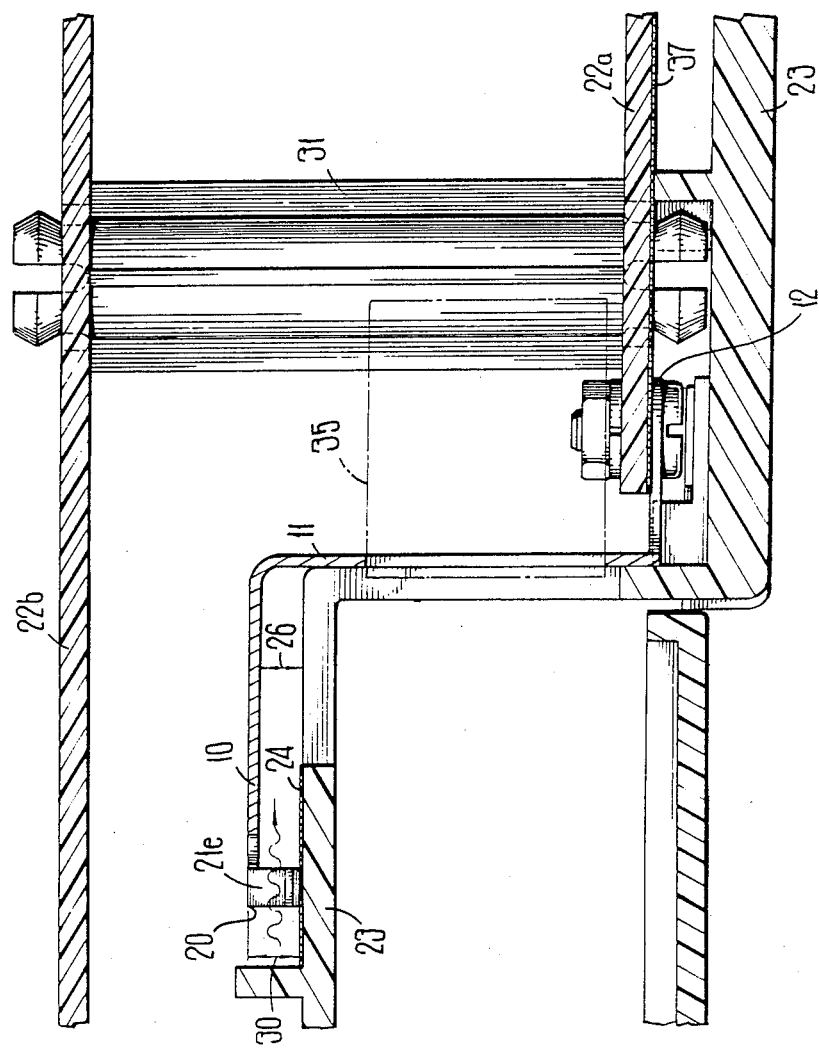

ic equipment
RECEPTACLE PANEL FOR ELECTRONIC DEVICE PROVIDING SIMPLE ASSEMBLY AND RFI SUPPRESSION

TECHNICAL FIELD

The present invention relates to electronic equipment enclosure assemblies and in particular relates to assemblies which require significant suppression or attenuation of free space radio frequency interference.

BACKGROUND OF THE INVENTION

In recent years, significant improvements in cost effective electronic devices, together with the widespread availability of low cost powerful small computers has led to a great proliferation of sophisticated peripheral devices for use with such computers. One of the most popular such peripheral device is the modem for effecting data communications over band limited analog communications channels.

Since the introduction of the Smartmodem 300 modem from Hayes Microcomputer Products, Inc. in 1981, the overwhelming majority of modems sold for use with personal computers have included at least one microprocessor chip for controlling the modem and providing other functional enhancements. Today, higher speed data communications are popular and common, up to and including the 9600 bit per second full duplex voice grade channel communication scheme specified by CCITT Recommendation V.32. Additionally, other very sophisticated computer peripherals, such as laser printers and the like, often require significant computing power within the peripheral. This requirement leads to the inclusion of high speed microprocessors and significant amounts of high speed digital circuitry within such peripheral devices.

Naturally, as a result of the fundamental laws of physics, as expressed by Maxwell's Equations, the employment of such devices produces radio frequency interference. All electrical engineering students are familiar with the elementary results modeled by the Fourier transform which shows that sharp rising edges on a periodic waveform produce a noise spectrum having significant components at the harmonics of the signal's fundamental frequency. Naturally, the result of pushing digital circuitry to higher clock speeds is that the harmonic frequencies of such signals become higher and higher.

As sophisticated computer peripherals entered the home in connection with low cost powerful computer systems in the late 1970's, the Federal Communications Commission of the United States of America promulgated Subpart J of Part 15 of Title 47 of the Code of Federal Regulations. These FCC regulations placed stringent limits on the allowable level of radio frequency signals which could emanate into free space from computer peripheral devices, as well as limits on the radio frequency signals which could be fed back into the power line cord of such a device. In particular, the regulatory environment in the United States as a result of these rules is to place stringent requirements on "Class B" computing devices which are generally defined as those which one can reasonably expect to find associated with the home computer.

The rationale for promulgation of these regulations was based on an increasing number of complaints about radio frequency interference from computing devices, particularly interference in the bands occupied by VHF broadcast television in the United States.

Thus, after the promulgation of these rules, a significant percentage of the computer peripheral manufacturing community in the United States, particularly those concentrating on devices to be used with small computers, went through a rigorous and steep learning curve with respect to design techniques for minimizing radio frequency interference from such devices. The knowledge acquired from this learning curve has continued to grow. However, as problems are solved, new ones are created by the concurrent introduction of higher speed devices. For example, not too many years ago 4 megaHertz was a practical upper limit on master clock speed for a typical microprocessor. Today, it is not uncommon to find microprocessors operating at master clock frequencies in the range of 16 to 25 megaHertz. This naturally leads to exacerbated problems of free space radio frequency interference signals.

As is well known to those skilled in the art, the main sources of radio frequency interference emissions from computer peripherals devices are (a) cables entering and exiting the devices; and (b) slits and openings in the enclosures. While cables remain the principal source of problems, primarily because they function both as cable and an effective antenna for the undesired radio frequency signals, manufacturers have gone to some significant extremes to seal up openings and prevent the inadvertent creation of slit and edge antennas on equipment enclosures. In the realm of suppression of signals from cables, it is now common practice to provide schemes for plugs, receptacles, and cables in which a secure connection to chassis ground is provided to conductors within the plug/receptacle combination, which conductors are in turn connected to shielding on the cable. This helps to greatly attenuate the antenna effect from the cables.

In the arena of prevention of inadvertent creation of slit antennas, it has become common practice to secure receptacle carrying panels or plates to other grounded portions of the equipment enclosure. This can cause assembly to become problematic when it is desired to, for example, have receptacles which are soldered onto the circuit boards of such devices and can still pass through a receptacle panel. The receptacle panel is typically, but not necessarily, located at the rear of the peripheral. While this is effective for RFI suppression, it leads to some significant undesirable constraints on physical assembly of the devices. In most modern electronic assembly procedures, all of the components which are to be soldered to the circuit boards are assembled to the boards in a manufacturing process separate from creation of the equipment enclosure. Therefore, if receptacles soldered to the board are used, it is necessary to perform some rather complex mechanical assembly steps to secure grounded conductors of such receptacles to a receptacle panel during the process of final assembly. This sometimes takes the form of riveting plate elements onto the circuit board, as is the common practice with expansion slot peripheral devices such as serial port cards and internal modems.

If such a scheme is used on larger devices, it is often necessary to employ more nuts and bolts between the receptacle panel and the rest enclosure in order to provide a secure chassis ground to the panel and prevent the creation of slit antennas.

When this combination is assembled, it can lead to a configuration in which several connector devices must be physically disconnected from the receptacle plate of the enclosure before the circuit board can be removed.

As is known to those skilled in the art, it is highly desirable in assembling electronic equipment to be able to provide the entire collection of circuit boards and connectors (often referred to as "the guts" of the device in the crude vernacular) into a unitary subassembly which may then easily be dropped into the enclosure for final assembly. The more complex procedures, described hereinabove, with respect to assembly of computer peripheral devices, have largely resulted from the requirement of good radio frequency interference ("RFI") suppression.

Naturally, it is possible to provide receptacle plates on the rear panels of equipment enclosures with openings of a specified size behind which a plurality of connectors soldered to a circuit board may be placed. Assembly techniques are available which can, within reasonable limits, assure good land area contacts between portions of the receptacles which need grounding and grounded portions of the equipment enclosure near the holes through which the receptacles pass. This is an acceptable arrangement for suppressing RFI but leads to the constraint that the dies (in the case of stamped metal enclosure elements) or molds (in the case of molded plastic enclosures) must be dedicated to the particular plug/receptacle configuration on the circuit board. So long as products are limited to one geographic market, there is essentially no problem with this.

However, in the case of modems, it is desirable to be able to provide a modem product compatible with both the power and telephone networks in various foreign countries. Those skilled in the art will be familiar with the fact that standard computer and telephone connector devices vary geographically throughout the world. This is also true for power line frequencies and accepted standard physical arrangements for plugs for same. As a result of this, the creation of specific dedicated holes in the receptacle panel of the enclosure, as described above, often leads to the requirement that a different set of holes be provided when essentially the same product is to be marketed overseas. In the case of injection molded plastic enclosures, this can lead to the very expensive requirement for a new mold for the portion of the enclosure which includes the receptacle panel when virtually nothing else needs to be changed about the enclosure.

Therefore, there is a need in the art to provide a receptacle panel usable on a computer peripheral device which can be placed in a large opening on an equipment enclosure.

Naturally, under the older method of providing a complete subassembly of the electronics, including the receptacles, as a unit which may be dropped into an enclosure, the only requirement for the enclosure was a sufficiently large hole where the receptacle plate resided to allow the user access to same. Heretofore, reversion to this preferred form of assembly has not been practical for the following reasons. In a device of any appreciable size, such a hole for receiving the receptacle panel will normally include at least one fairly long dimension. Securely placing the subassembly in a position that abuts such a hole in a manner consistent with good RFI suppression techniques is difficult for the following reasons. As the electronic assembly becomes more complex, more and more mechanical elements are specified to a particular size with a certain range of tolerances. The more complex the device, the more tolerances have to be considered. The greater the number of tolerances, the greater the range of overall results which can be encountered if, for example, all of the tolerances deviate from the ideal value in the same sense.

The net result of this is the significant probability that a long narrow slit can be created between a receptacle panel so assembled and the large hole in an enclosure for receiving the panel. When the long dimension of the slit is on the order of half the wave length of a radio frequency signal emitted by the circuitry of the subassembly, the slit will act as a significant radiator of that frequency. In a complex device, if the apparatus is sized to assure that good grounding contact will take place between the receptacle plate and the periphery of the hole on the equipment enclosure, then it is likely that certain tolerance conditions, all of the same sense, may be encountered which will cause the electronic/receptacle plate subassembly not to fit properly in the enclosure.

Additionally, receptacle plates tend to be oriented vertically on a panel of such enclosures and it is common to drop an electronic subassembly into the enclosure vertically. This leads to difficulty in urging the assembly laterally toward the hole to assure that the receptacle plate makes good contact.

Therefore, in order to provide the advantages of the essentially prior art method of assembly encountered with attaching a separate receptacle plate as part of the electronic subassembly, there is a need for an innovative way of overcoming the problems outlined above. In particular, there is a need for providing a receptacle plate which will defeat the natural tendency to create an elongated slit antenna at the opening in an enclosure for receiving a receptacle panel. This must be created without creating the additional requirement of external rivets, bolts, screws, and the like to be passed through the enclosure and the receptacle plate. Additionally, any such arrangement must be able to deal with reasonably expected values of mechanical tolerances for the elements of the subassembly enclosure, and still not create RFI problems when the device is manufactured. To this end, it should be noted that manufacturability of an arrangement which will dependably meet the FCC requirements with respect to RFI suppression is a significant problem for modern electronics manufacturers.

SUMMARY OF THE INVENTION

The present invention fulfills the needs in the prior art. Broadly stated, the present invention provides a receptacle plate which defeats the natural tendency to create an elongated slit antenna at the opening in an enclosure for receiving a receptacle plate. The present invention provides effective suppression of radio frequency interference (RFI) while achieving the desired goal of unitary subassembly which may easily be dropped into the enclosure for final assembly.

Furthermore, the present invention is capable of handling reasonably expected values of mechanical tolerances for the elements of the subassembly enclosure. The present invention provides a receptacle plate which is secured to other grounded portions of the equipment enclosure.

In the preferred form of the present invention an L-shaped strip of electrically conductive material, such as stainless steel, is used. One of the panels of this strip contains openings for receptacles. This panel also contains an apparatus for securing the panel to a circuit ground conductor on the circuit board. This first panel is prevented from acting as an elongated antenna because it is well grounded to the enclosure around its periphery. Also, in the preferred embodiment, two centrally located grounds are attached where a DB-25 receptacle is positioned.

The outer edge of the second panel of this strip, in the preferred form of the present invention, solves the potential problems of RFI and lack of ground contact. The second panel overlaps a conductive surface of the electronic enclosure at an opening in the enclosure. Because the mechanical tolerances of the enclosure cannot guarantee that the panel will make a good contact with the enclosure, there is no assurance that the panel will be secured to the grounded conductive surface. If the outer edge of this panel is continuous and unbroken, it is highly probable that the edge will operate as an elongated slit antenna. However, both of these dilemmas are handled by the creation of long narrow strips, or fingers, along the outer edge of the second panel. These fingers have a flexibility that is sufficient to guarantee that the panel will be urged against the grounded conductive surface of the enclosure. Further, the fingers provide discontinuity in the edge of the panel so as to suppress RFI, and thus, the edge does not act as an elongated slit antenna.

The length of these fingers is calculated as a predetermined fraction of the wave length of the highest frequency signal emitted at a substantial level by the circuitry of the subassembly. This predetermined fraction is anywhere between five and fifty percent, inclusive. Those skilled in this particular art have varying opinions regarding a specific fraction.

It is clear that an appropriate predetermined fraction is less than one half the wave length, and it is generally considered that a radiating length less than one quarter wave length makes an elongated edge or wire a poor radiator at that frequency.

There is naturally a point of diminishing return but, over a significant range of lengths, attenuation increases as the length of the longest free edge decreases.

In the preferred embodiment of the present invention, a figure of 5 percent of the wave length of the highest frequency of concern has been chosen as a conservative figure which will give good suppression of RFI free space emissions.

That the present invention achieves these objects and overcomes the above-noted drawbacks of the prior art will be appreciated from the following detailed description of the preferred embodiment.

BRIEF DESCRIPTION OF THE DRAWINGS

FIG. 1 is a pictorial view of the preferred embodiment of the present invention.

FIG. 2 is a top plan view of the preferred embodiment of the present invention.

FIG. 3 is a front elevational view of the preferred embodiment of the present invention.

FIG. 5 is a cross-sectional view of the preferred embodiment of the present invention installed in an enclosure and connected to an electronic subassembly.

DETAILED DESCRIPTION OF THE DRAWINGS

Figure 4:
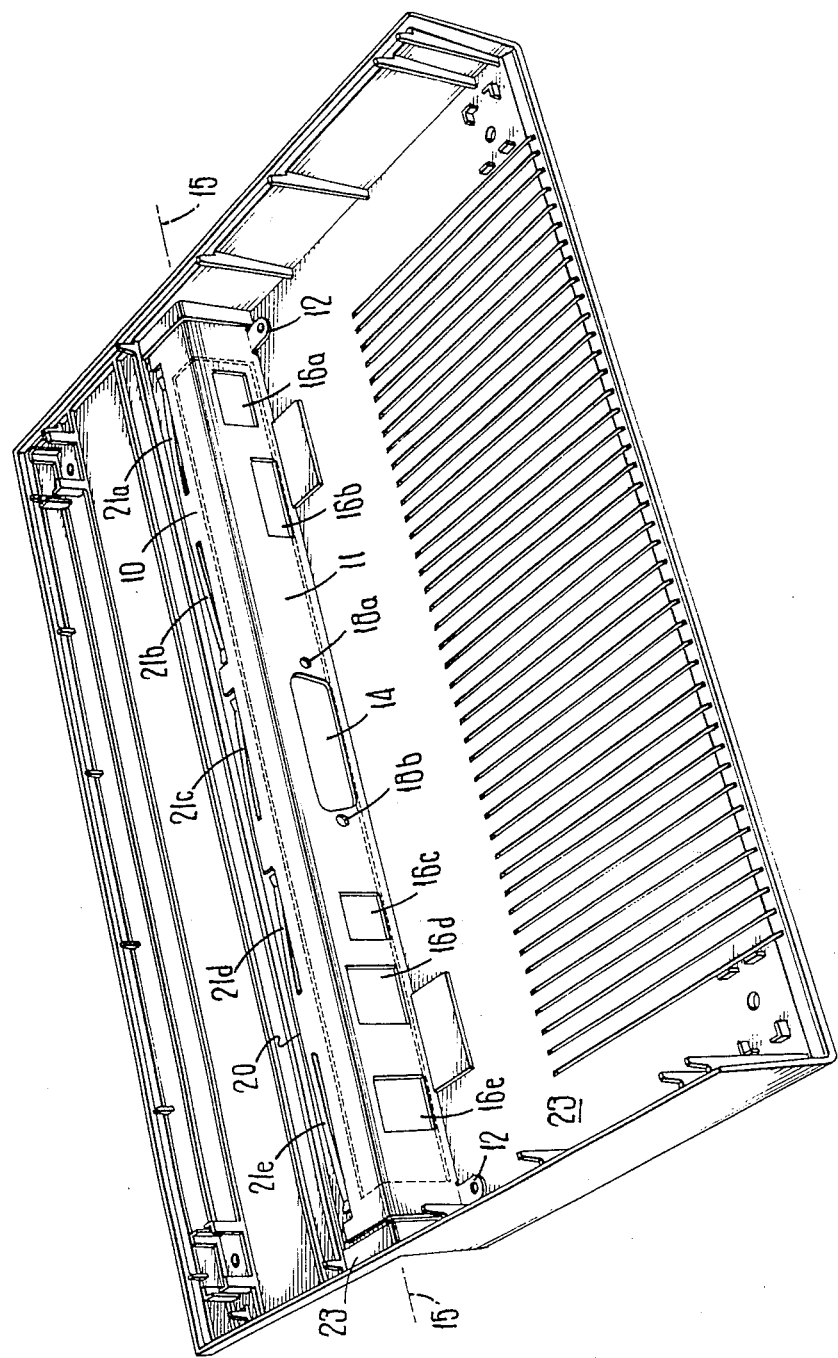
FIG. 4 is a pictorial view of the preferred embodiment of the present invention mounted in an enclosure.

Turning first to FIG. 1, a pictorial view of the preferred embodiment of the present invention is shown. The preferred embodiment is one in which an elongated strip of electrically conductive material, such as stainless steel, is substantially L-shaped. The strip is divided into first panel 11 and second panel 10, said panels having respective first edge 19 and second edge 20 opposite the line 15 at which the panels perpendicularly intersect.

As may be seen in FIG. 1, the first panel 11 contains a primary receptacle opening 14 and secondary receptacle openings 16a, 16b, 16c, 16d, and 16e. The primary receptacle opening 14 is located between two receptacle mounting holes 18a and 18b through which a receptacle is mounted to the electronic apparatus. This mounting serves to ground the first panel 11. The preferred embodiment of the present invention is used in a modem and a type DB-25 receptacle is mounted in primary receptacle opening 14. The hood of this receptacle is secured to panel 11 by screws (not shown) passed through holes 18a and 18b. This provides good circuit ground contact to the hood of the receptacle (not shown) which is ultimately connected to the hood of a mating plug, which hood is connected to shielding on the cable. This gives the known impact of providing good shielding of the signal carrying conductors within the cable, which conductors represent the largest single source of free space emissions of radio frequency noise from computer peripheral devices.

In the preferred embodiment, secondary openings 16c, 16d, and 16e are for holding telephone jacks, one each for a leased line and a standard dial-up line, and a third for a standard telephone set. Secondary hole 16a allows a power switch in the form of a conventional rocker switch to be passed through the rear panel and receptacle hole 16b is designed for a customized power carrying cable to provide operating power to the apparatus to which the preferred embodiment is attached. The first panel 11 also contains two mounting plates 12, located at opposite ends of the first edge 19. These mounting plates 12 provide a means for mounting the preferred embodiment to the circuit board of the subassembly, providing one-piece removal of the subassembly from the enclosure and also further grounding the first panel 11.

The edge 20 does not necessarily come into contact with the surface 24 of the enclosure 23, and the open space 26 between the edge and the surface 24 could possibly become an elongated slit antenna. This possibility is avoided through the creation of long narrow fingers 21a–21e formed by slitting the second panel 10 adjacent the second edge 20. These fingers provide discontinuities in the second edge 20, and thereby prevent RFI. Additionally, the fingers 21a–21e are sufficiently flexible to be urged against the conductive surface 24 of the enclosure if the mechanical tolerances of the enclosure and subassembly do not allow the second edge 20 to rest directly upon the surface. If needed to meet standards for maximum permitted RF emissions, appropriate fingers can also be added to the vertical first panel 11.

Turning next to FIG. 2, a top plan view of the preferred embodiment of the present invention, the locations of the mounting plates 12 can be clearly seen at opposite ends of the first edge 19. It is also clear in FIG.

2 that if the fingers 21a–21e were not created in the second panel 10, the continuous second edge 20 could easily become an elongated slit antenna. The length of the fingers 21a–21e is calculated so as to provide the greatest possible RFI suppression.

FIG. 3 provides a front elevational view of the preferred embodiment. This view shows the flexibility of the fingers 21a–21e away from the second edge 20, which urges the second panel 10 against the conductive surface 24 of the enclosure 23. FIG. 3 also shows the receptacle mounting holes 18a, 18b which serve to mount a receptacle in the primary receptacle opening 14 to the electronic apparatus while simultaneously grounding the first panel 11. FIG. 3 also shows the secondary receptacle openings 16a–16e, which are used for telephone line connections, a power switch, and a power drive. The locations of the mounting plates 12 at the ends of the first edge 19 on the first panel 11 are also seen in this view.

FIG. 4 is a pictorial view of the preferred embodiment mounted in an enclosure. This view shows the fingers 21a–21e being urged against the conductive surface of the enclosure 23, so that the second panel 10 is in contact with the enclosure 23.

FIG. 5 is a cross-sectional view of the preferred embodiment installed in an enclosure and connected to an electronic subassembly. This view shows how the mounting plates 12 secure the preferred embodiment in the enclosure 23. The outline of a typical receptacle installed in one of the openings 14 or 16a–16e is shown at 35. The mounting plates 12 come into contact with the circuit board 22a, which has a grounded conductive surface 37 and therefore grounds the first panel 11 of the preferred embodiment. The open space 26 is an exaggerated illustration of how the mechanical tolerances of the subassembly can prevent the second panel 10 from contacting the grounded conductive surface 24 of the enclosure 23. This view also shows the flexibility 30 of the fingers 21a–21e, such that the mechanical tolerance can be overcome and proper grounding of the second panel 10 can occur.

It should also be noted in FIG. 5 that the circuit boards 22a and 22b are held together by a stand-off 31, and that when the preferred embodiment is mounted, by the mounting plates 12, to the circuit boards 22a and 22b rather than to the enclosure 23, the entire subassembly, including the preferred embodiment, may be lifted from or installed into the enclosure in one piece.

What is claimed is:

1. A receptacle plate for mounting in an enclosure of the type having at least one receptacle opening and means defining a conductive surface of said enclosure proximate said receptacle opening, said enclosure being for housing electronic apparatus which emits radio frequency energy over a spectrum characterized by a predetermined highest frequency of interest, comprising in combination:

an elongated strip of electrically conductive material bent along a predetermined line to divide said strip into first and second panels such that said strip is substantially L-shaped in cross sections perpendicular to said predetermined line, said panels having respective first and second edges opposite said predetermined line;

means for securing said strip to said electronic apparatus such that, when said electronic apparatus is assembled within said enclosure, said second edge overlaps said conductive surface of said enclosure at said receptacle opening;

grounding means for providing an electrical ground connection between said strip and said electronic apparatus; and at least one elongated finger formed at said second edge to provide a discontinuity in said second edge, said finger being substantially parallel to said second edge and of a length substantially equal to a predetermined fraction of the wavelength of said predetermined highest frequency of interest.

2. A receptacle plate as recited in claim 1 wherein:
said grounding means includes means for establishing a plurality of ground connections between a ground plane within said electronic apparatus and a like plurality of spaced apart points on said first panel.

3. A receptacle plate as recited in claim 1 wherein:
said electrically conductive material is stainless steel.

4. A receptacle plate as recited in claim 1 wherein said elongated finger is bent away from the plane of said second panel sufficiently to cause same to be urged against said conductive surface of said enclosure when said electronic apparatus is placed within said enclosure.

5. Apparatus for mounting in an enclosure of the type having at least one receptacle opening and means defining a conductive surface of said enclosure proximate said receptacle opening, said enclosure being for housing electronic apparatus which emits radio frequency energy over a spectrum characterized by a predetermined highest frequency of interest, comprising in combination:

an elongated plate of electrically conductive material having respective first and second edges;

means for mounting said plate to said electronic apparatus such that, when said electronic apparatus is assembled within said enclosure, said second edge overlaps a conductive surface of said enclosure at said receptacle opening;

grounding means for providing an electrical ground connection between said strip and said electronic apparatus; and at least one elongated finger formed at said second edge to provide a discontinuity in said second edge, said finger being substantially parallel to said second edge and of a length substantially equal to a predetermined fraction of the wavelength of said predetermined highest frequency of interest.

6. Apparatus as recited in claim 5 wherein:
said grounding means includes means for establishing a plurality of ground connections between a ground plane within said electronic apparatus and a like plurality of spaced apart points on said plate.

7. Apparatus as recited in claim 5 wherein:
said electrically conductive material is stainless steel.

8. Apparatus as recited in claim 5 wherein said elongated finger is bent away from the plane of said second edge sufficiently to cause same to be urged against said conductive surface of said enclosure when said electronic apparatus is placed within said enclosure.

* * * * *